(12) United States Patent
Tsuei et al.

(10) Patent No.: US 6,946,033 B2
(45) Date of Patent: Sep. 20, 2005

(54) HEATED GAS DISTRIBUTION PLATE FOR A PROCESSING CHAMBER

(75) Inventors: Lun Tsuei, Mountain View, CA (US); Soovo Sen, Sunnyvale, CA (US); Ju-Hyung Lee, San Jose, CA (US); Juan Carlos Rocha-Alvarez, Sunnyvale, CA (US); Inna Shmurun, Foster City, CA (US); Maosheng Zhao, Santa Clara, CA (US); Troy Kim, Mountain View, CA (US); Shankar Venkataraman, Santa Clara, CA (US)

(73) Assignee: Applied Materials Inc., Santa Clara, CA (US)

( * ) Notice: Subject to any disclaimer, the term of this patent is extended or adjusted under 35 U.S.C. 154(b) by 30 days.

(21) Appl. No.: 10/245,443

(22) Filed: Sep. 16, 2002

(65) Prior Publication Data
US 2004/0050492 A1 Mar. 18, 2004

(51) Int. Cl.[7] .................. C23C 16/00; C23F 1/00; H01L 21/306
(52) U.S. Cl. .............. 118/715; 118/722; 118/724; 156/345.29; 156/345.33; 156/345.34
(58) Field of Search .................... 118/715, 722, 118/724, 728, 50; 156/345.29, 345.33, 345.34, 345.35

(56) References Cited

U.S. PATENT DOCUMENTS

| 4,539,933 | A | * | 9/1985 | Campbell et al. ........... 118/719 |
| 4,545,327 | A | * | 10/1985 | Campbell et al. ........... 118/719 |
| 4,641,603 | A | * | 2/1987 | Miyazaki et al. ............ 118/724 |
| 4,792,378 | A | * | 12/1988 | Rose et al. .................. 438/706 |
| 4,803,948 | A | * | 2/1989 | Nakagawa et al. .......... 118/725 |
| 4,872,947 | A | * | 10/1989 | Wang et al. .................. 216/38 |
| 5,000,113 | A | * | 3/1991 | Wang et al. ............. 118/723 E |

(Continued)

FOREIGN PATENT DOCUMENTS

| EP | 0 441 710 A1 | 8/1991 | .......... G05D/23/19 |
| EP | 0 477 453 A1 | 4/1992 | ........... G01R/31/28 |
| EP | 06142173 | 6/1994 | .......... H01L/21/205 |
| EP | 0 714 998 A2 | 11/1995 | ........... C23C/16/44 |
| EP | 08187212 | 7/1996 | ........... C23C/16/44 |
| EP | 0 776 988 A2 | 6/1997 | ........... C23C/14/50 |
| JP | 326587 | 6/1994 | .......... H01L/21/205 |

*Primary Examiner*—Rudy Zervigon
(74) *Attorney, Agent, or Firm*—Moser, Patterson & Sheridan

(57) ABSTRACT

An apparatus for distributing gas in a processing system. In one embodiment, the system includes a gas distribution assembly having a gas distribution plate. The gas distribution plate defines a plurality of holes through which gases are transmitted. The assembly further includes a gas box coupled to the gas distribution plate, in which the gas box is configured to supply the gases into the plurality of holes. The assembly further includes a means for reducing heat transfer from the gas box to the gas distribution plate.

17 Claims, 6 Drawing Sheets

U.S. PATENT DOCUMENTS

| | | | | |
|---|---|---|---|---|
| 5,071,485 A | * | 12/1991 | Matthews et al. | 134/2 |
| 5,074,456 A | | 12/1991 | Degner et al. | 228/121 |
| 5,108,792 A | * | 4/1992 | Anderson et al. | 427/248.1 |
| 5,155,336 A | | 10/1992 | Gronet et al. | 219/411 |
| 5,200,232 A | | 4/1993 | Tappan et al. | 427/569 |
| 5,275,977 A | | 1/1994 | Otsubo et al. | 437/235 |
| 5,328,515 A | * | 7/1994 | Chouan et al. | 118/723 ME |
| 5,344,492 A | | 9/1994 | Sato et al. | 118/725 |
| 5,357,715 A | | 10/1994 | Hiramatsu | 451/357 |
| 5,445,709 A | | 8/1995 | Kojima et al. | 216/71 |
| 5,584,971 A | | 12/1996 | Komino | 204/192.13 |
| 5,595,606 A | | 1/1997 | Fujikawa et al. | 118/725 |
| 5,632,820 A | * | 5/1997 | Taniyama et al. | 118/724 |
| 5,647,945 A | * | 7/1997 | Matsuse et al. | 156/345.38 |
| 5,653,806 A | | 8/1997 | Van Buskirk | 118/715 |
| 5,665,166 A | | 9/1997 | Deguchi et al. | 118/723 |
| 5,766,364 A | | 6/1998 | Ishida et al. | 118/725 |
| 5,781,693 A | | 7/1998 | Ballance et al. | 392/416 |
| 5,835,334 A | | 11/1998 | McMillin et al. | 361/234 |
| 5,846,375 A | | 12/1998 | Gilchrist et al. | 156/345 |
| 5,882,411 A | * | 3/1999 | Zhao et al. | 118/715 |
| 5,885,356 A | * | 3/1999 | Zhao et al. | 118/723 ER |
| 5,906,683 A | | 5/1999 | Chen et al. | 118/724 |
| 5,950,925 A | * | 9/1999 | Fukunaga et al. | 239/132.3 |
| 5,953,827 A | | 9/1999 | Or et al. | 34/58 |
| 5,994,678 A | * | 11/1999 | Zhao et al. | 219/530 |
| 6,035,101 A | | 3/2000 | Sajoto et al. | 392/416 |
| 6,072,163 A | | 6/2000 | Armstrong et al. | 219/497 |
| 6,086,677 A | | 7/2000 | Umotoy et al. | 118/715 |
| 6,091,060 A | | 7/2000 | Getchel et al. | 219/483 |
| 6,110,556 A | * | 8/2000 | Bang et al. | 428/64.1 |
| 6,117,245 A | | 9/2000 | Mandrekar et al. | 118/724 |
| 6,148,761 A | | 11/2000 | Majewski et al. | 118/715 |
| 6,302,964 B1 | | 10/2001 | Umotoy et al. | 118/715 |
| 6,348,725 B2 | | 2/2002 | Cheung et al. | 257/642 |
| 6,364,954 B2 | | 4/2002 | Umotoy et al. | 118/715 |
| 6,379,466 B1 | | 4/2002 | Sahin et al. | 118/724 |
| 6,433,314 B1 | | 8/2002 | Mandrekar et al. | 219/390 |
| 6,461,435 B1 | * | 10/2002 | Littau et al. | 118/715 |
| 6,477,980 B1 | * | 11/2002 | White et al. | 118/723 E |
| 6,537,420 B2 | * | 3/2003 | Rose | 156/345.34 |
| 2002/0016085 A1 | | 2/2002 | Huang et al. | 438/798 |
| 2002/0078893 A1 | | 6/2002 | Os et al. | 118/723 |
| 2002/0084257 A1 | | 7/2002 | Bjorkman et al. | 216/72 |

* cited by examiner

HEATED GAS DISTRIBUTION PLATE FOR A PROCESSING CHAMBER

CROSS-REFERENCE TO RELATED APPLICATIONS

This application is related to U.S. Ser. No. 10/245,442 by Lee et al. and entitled "METHODS FOR OPERATING A CHEMICAL VAPOR DEPOSITION CHAMBER USING A HEATED GAS DISTRIBUTION PLATE."

BACKGROUND OF THE INVENTION

1. Field of the Invention

Embodiments of the present invention generally relate to gas distribution plates utilized in semiconductor wafer processing equipment, and more particularly to a gas distribution plate or faceplate for use in chemical vapor deposition (CVD) chambers.

2. Description of the Related Art

In a CVD chamber, a gas distribution plate is commonly used to uniformly distribute gases into a chamber. Such a uniform gas distribution is necessary to achieve uniform deposition characteristics on the surface of a substrate located within the chamber. The gas distribution plate is generally connected to a gas box above the gas distribution plate. The gas box is typically water-cooled to a temperature of approximately under 100 degrees Celsius. A heater is generally disposed in a substrate support member beneath the gas distribution plate. The heater is typically heated to a temperature of approximately between 100 to 600 degrees Celsius. Consequently, the temperature of the gas distribution plate is somewhere in between the temperature of the gas box and the temperature of the heater. However, since the gas distribution plate is connected to the gas box, the temperature of the gas distribution plate is generally closer to the temperature of the gas box than the temperature of the heater. As a result of the low temperature of the gas distribution plate (in comparison to the temperature of the heater), a high amount of film is often deposited on the gas distribution plate during processing, which leads to a longer chamber cleaning period and an increase in clean gas consumption.

Therefore, a need exists in the art for an improved gas distribution plate.

SUMMARY OF THE INVENTION

Embodiments of the present invention are generally directed to an apparatus for distributing gas in a processing system. In one embodiment, the system includes a gas distribution assembly having a gas distribution plate. The gas distribution plate defines a plurality of holes through which gases are transmitted. The assembly further includes a gas box coupled to the gas distribution plate, in which the gas box is configured to supply the gases into the plurality of holes. The assembly further includes a means for reducing heat transfer from the gas box to the gas distribution plate.

In another embodiment, the present invention is directed to an apparatus for distributing gas in a processing system, which includes a gas distribution assembly that has a gas distribution plate defining a plurality of holes through which gases are transmitted and a gas box coupled to the gas distribution plate. The gas box is configured to supply the gases into the plurality of holes. The gas distribution assembly further includes a hard radio frequency (RF) gasket disposed between the gas distribution plate and the gas box. The gasket is configured to reduce heat transfer from the gas distribution plate to the gas box.

In yet another embodiment, the present invention is directed to an apparatus for distributing gas in a processing system, which includes a gas distribution assembly having a gas box configured to supply gases into a process chamber and a gas distribution plate. The gas distribution plate includes a plurality of holes through which the gases are distributed into the process chamber and a flange portion coupled to the gas box. The flange portion defines one or more recesses configured to reduce heat transfer from the gas distribution plate to the gas box.

In still another embodiment, the present invention is directed to an apparatus for distributing gas in a processing system, which includes a gas distribution assembly having a gas box configured to supply gases into a process chamber and a gas distribution plate. The gas distribution plate includes a plurality of holes through which the gases are distributed into the process chamber and a flange portion. A thermal isolator is disposed between the gas box and the flange portion of the gas distribution plate to reduce heat transfer from the gas distribution plate to the gas box.

In still yet another embodiment, the present invention is directed to a gas distribution plate, including a bottom plate having a plurality of holes through which gases are transmitted, a channel disposed circumferentially around a perimeter of the bottom plate, and a means for heating the gas distribution plate.

In a further embodiment, the present invention is directed to a gas distribution plate, which includes a bottom plate having a plurality of holes through which gases are transmitted. A heating element is disposed circumferentially around a perimeter of the bottom plate. The heating element is configured to heat the gas distribution plate.

In another further embodiment, the present invention is directed to a gas distribution plate, including a bottom plate having a plurality of holes through which gases are transmitted, a channel disposed circumferentially around a perimeter of the bottom plate through which a high temperature heat exchanger fluid is transmitted. The heat exchanger fluid is heated by a heat source to heat the gas distribution plate.

BRIEF DESCRIPTION OF THE DRAWINGS

So that the manner in which the above recited features of the present invention can be understood in detail, a more particular description of the invention, briefly summarized above, may be had by reference to the embodiments illustrated in the appended drawings and described in the specification. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
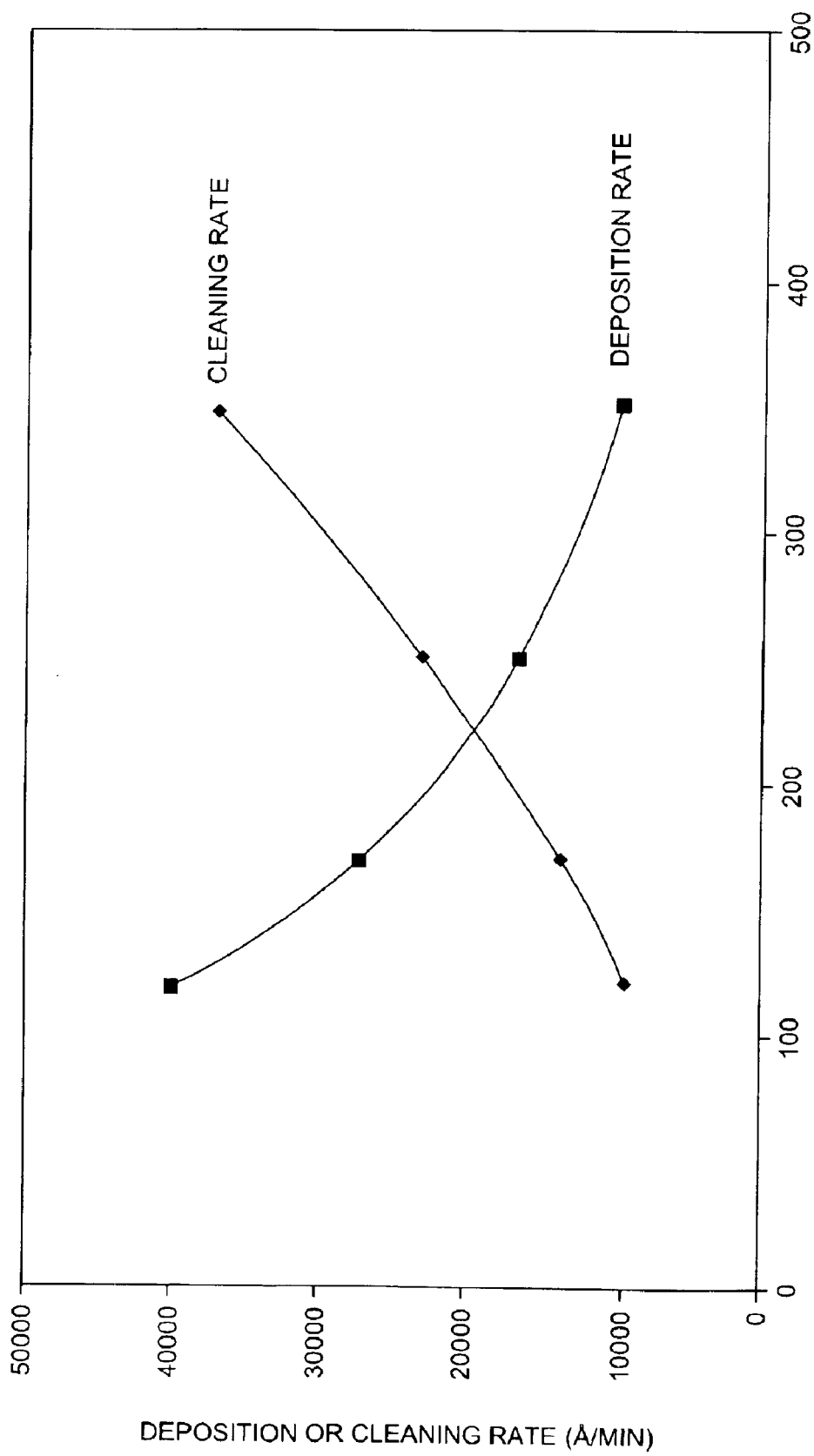
FIG. 1 is a graph illustrating the effect on the clean rate and the deposition rate as the temperature of the gas distribution plate increases in accordance with an embodiment of the invention.

Recently, it has been observed (as shown in FIG. 1) that at low temperatures, the deposition rate on a gas distribution plate during processing is much higher than at high temperatures and the etch rate on the gas distribution plate during cleaning is much lower than at high temperatures. Accordingly, embodiments of the present invention are generally directed to a gas distribution plate that has the capability of maintaining a high temperature. By maintaining a high temperature, the deposition rate on the gas distribution plate during processing is minimized, while the clean rate is maximized. As the deposition on the gas distribution plate is minimized, gas consumption and the chamber-cleaning period are also minimized, thereby increasing throughput.

Figure 2:
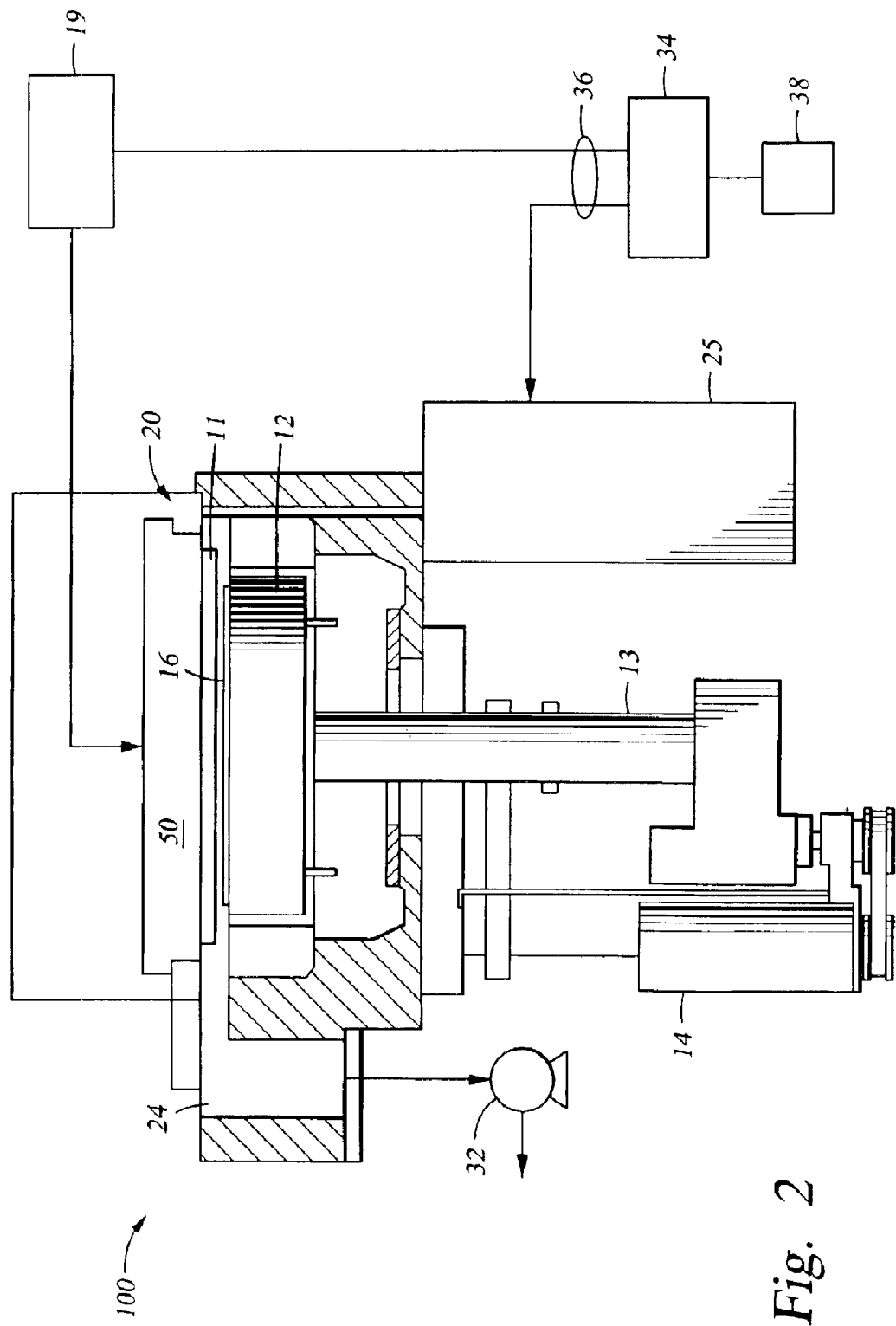
FIG. 2 is a cross-sectional view of a CVD chamber in accordance with various embodiments of the invention shown in FIGS. 4A–6B.

FIG. 2 illustrates a cross-sectional view of a CVD chamber 100 in accordance with various embodiments of the invention shown in FIGS. 4A–6B. The chamber 100 includes a gas distribution assembly 20, which includes a gas box 50 connected to a gas distribution plate or faceplate 11. The gas box 50 is typically water-cooled to a temperature of approximately below 100 degrees Celsius. A substrate support pedestal 12 is disposed below the gas distribution plate 11 so as to define a processing region therebetween for processing a substrate 16. The substrate support pedestal 12 is generally heated by a heater (not shown) at approximately 100 degrees Celsius to 600 degrees Celsius. As a result, the bottom surface of the gas distribution plate 11 is heated by radiation from the heater and/or the plasma, while the top surface of the gas distribution plate 11 is cooled from being in contact with the gas box 50. The gas box 50 supplies processing gases into the chamber 100 through inlets or holes (not shown) in the gas distribution plate 11 so that the gases may be uniformly distributed across the processing region. The processing gases are exhausted through a port 24 by a vacuum pump system 32.

The substrate support pedestal 12 is mounted on a support stem 13 so that the substrate support pedestal 12 can be controllably moved by a lift motor 14 between a lower (loading/off-loading) position and an upper (processing) position. Motors and optical sensors can be used to move and determine the position of movable mechanical assemblies, such as, the throttle valve of the vacuum pump 32 and the motor for positioning the substrate support pedestal 12.

A thermal or plasma enhanced process may be performed in the chamber 100. In a plasma process, a controlled plasma can be formed adjacent to the substrate 16 by applying RF energy to the gas distribution plate 11 from RF power supply 25 with the substrate support pedestal 12 grounded. An RF power supply 25 can supply either a single or mixed frequency RF power to the gas distribution plate 11 to enhance the decomposition of any reactive species introduced into the chamber 100. A mixed frequency RF power supply typically supplies power at a high RF frequency of about 13.56 MHz and at a low RF frequency of about 350 kHz.

A system controller 34 controls the motor 14, the gas mixing system 19, and the RF power supply 25 over control lines 36. The system controller 34 may also control analog assemblies, such as mass flow controllers and RF generators. The system controller 34 controls the activities of the CVD processing chamber 100 and executes system control software stored in a memory 38, which may be a hard disk drive, a floppy disk drive, and a card rack. The controller 34 may be one of any form of general purpose computer processor (CPU) that can be used in an industrial setting for controlling various chambers and sub-processors. Various support circuits may be coupled to the CPU for supporting the processor in a conventional manner.

Software routines may be stored in the memory 38 or executed by a second CPU that is remotely located. The software routines are generally executed to perform process recipes or sequences and to dictate the timing, mixture of gases, RF power levels, substrate support pedestal position, and other parameters of a particular process. The software routines, when executed, transform the general purpose computer into a specific process computer that controls the chamber operation so that a chamber process is performed. Alternatively, the software routines may be performed in a piece of hardware as an application specific integrated circuit or a combination of software or hardware. Other details of the CVD processing chamber 100 may be described in U.S. Pat. No. 5,000,113, entitled "A Thermal CVD/PECVD Processing chamber and Use for Thermal Chemical Vapor Deposition of Silicon Dioxide and In-situ Multi-step Planarized Process", issued to Wang et al., and assigned to Applied Materials, Inc., the assignee of the invention, and is incorporated by reference herein to the extent not inconsistent with the invention.

Figure 3:
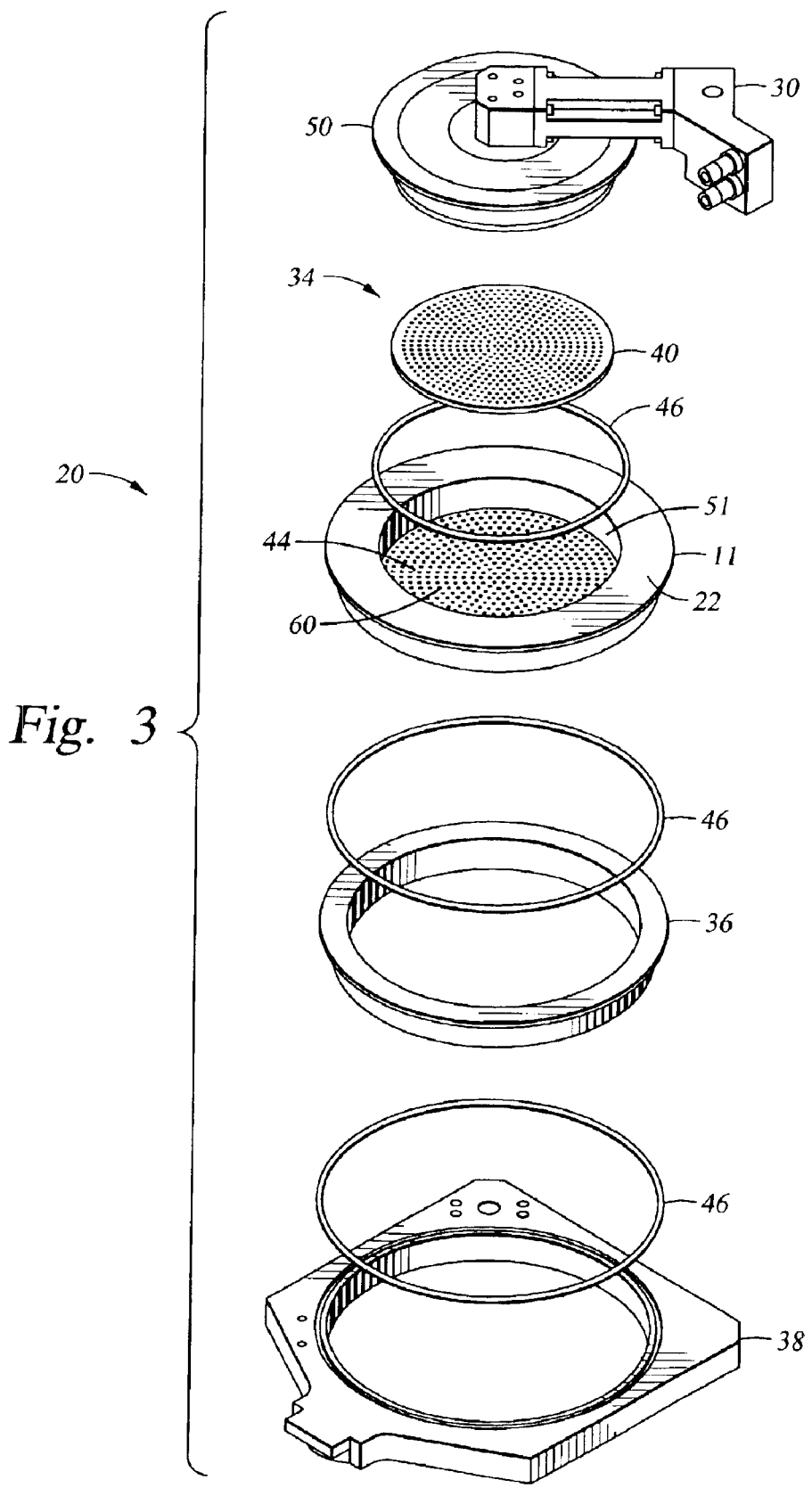
FIG. 3 is an exploded view of the gas distribution assembly in accordance with various embodiments of the invention shown in FIGS. 4A–6B.

FIG. 3 illustrates an exploded view of the gas distribution assembly 20 in accordance with various embodiments of the invention shown in FIGS. 3A–5B. The gas distribution assembly 20 includes a gas manifold 30, the gas box 50 (or gas injection cover plate), a showerhead assembly 34, and an isolator 36, all of which are mounted on an electrically grounded chamber lid 38. The isolator 36 is generally composed of a non-conductor material to isolate RF power from the grounded chamber lid 38. The showerhead assembly 34 includes a perforated blocker plate 40 and the gas distribution plate 11. The blocker plate 40 is generally a flat circular member having a plurality of holes. The gas distribution plate 11 is a dish-shaped device having a circular, centrally disposed cavity defined by a side wall 51 and a bottom plate 60 through which are formed a plurality of holes 44. The blocker plate 40 and the gas distribution plate 11 are configured to provide a uniform distribution of gases over the substrate surface through their respective holes. An annular flange portion 22 of the gas distribution plate 11 projects outwardly in a horizontal plane from the upper portion of the gas distribution plate 11. The flange portion 22 serves to provide engagement of the gas distribution plate 11 with the gas box 50. A cavity between the blocker plate 40 and the gas box 50 also serves as an additional agitation stage to continue mixing the process gases. 0-rings 46 are disposed between the various components to help ensure hermetic seals to prevent leakage of the gases.

Figure 4A:
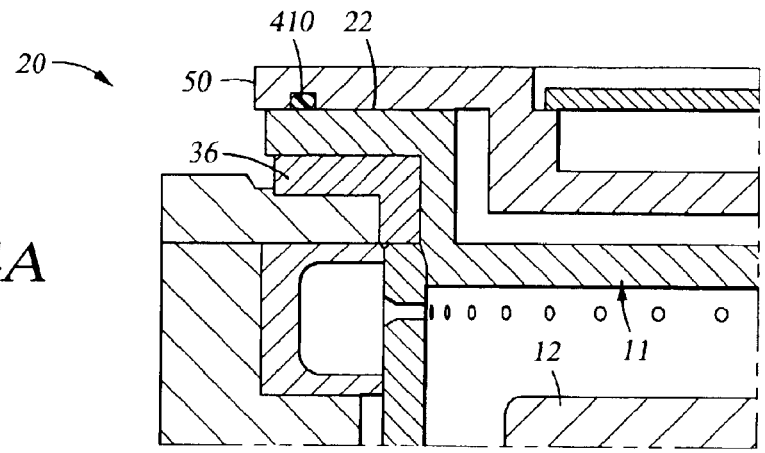
FIGS. 4A–C illustrate partial cross-sectional views of the gas distribution assembly in accordance with various embodiments of the invention.

FIG. 4A illustrates a partial cross-sectional view of the gas distribution assembly 20 in accordance with one embodiment of the invention. As illustrated, the flange portion 22 of the gas distribution plate 11 is in contact with the gas box 50. Typically, a soft RF gasket is disposed between the flange portion 22 and the gas box 50. In accordance with this embodiment of the invention, a hard RF gasket 410 is disposed between the flange portion 22 and the gas box 50 to reduce the contact area between the gas distribution plate 11 and the gas box 50. The hard RF gasket 410, in effect, increases the distance or space between the flange portion 22 and the gas box 50. In this manner, heat transfer/loss from the gas distribution plate 11 to the gas box 50 may be minimized.

Figure 4B:
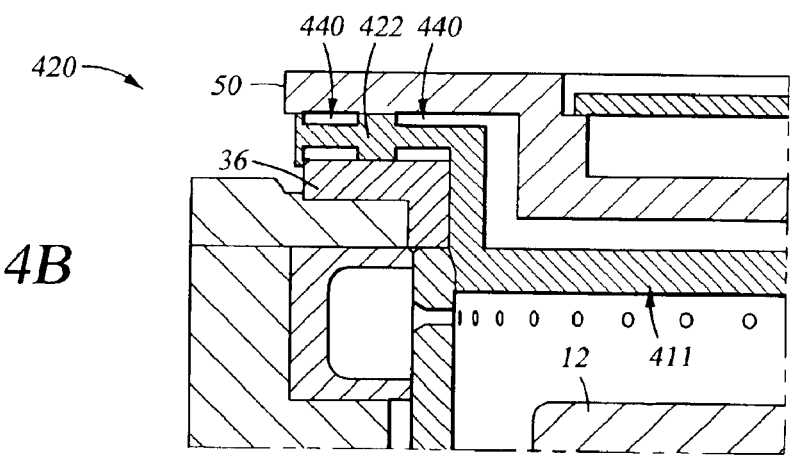

Another embodiment in which heat transfer may be minimized from the gas distribution plate is illustrated in FIG. 4B. In this embodiment, the gas assembly 420 includes a gas distribution plate 411, which has a flange portion 422 in contact with a gas box 50. The flange portion 422 defines recesses or grooves 440, which provides a distance between the flange portion 422 and the gas box 50 or the isolator 36. In this manner, the recesses 440 are designed to reduce the contact area between the gas box 50 and the flange portion 422, thereby minimizing heat transfer from the gas distribution plate 411 to the gas box 50.

Figure 4C:
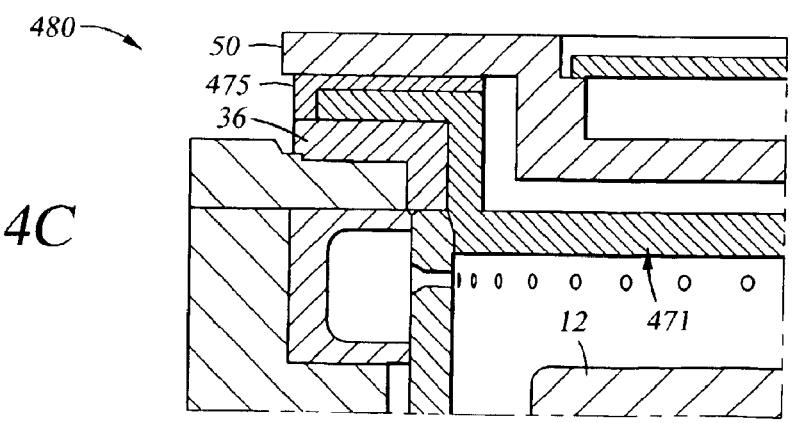

Yet another embodiment in which heat transfer may be minimized from the gas distribution plate is illustrated in FIG. 4C. In this embodiment, a thermal isolator 475 is disposed between a gas distribution plate 471 and the gas box 50. The thermal isolator 475 may be made from any material, such as ceramic, that provides thermal insulation between the gas distribution plate 471 and the gas box 50. By disposing the thermal isolator 475 between the gas distribution plate 471 and the gas box 50, the gas distribution plate 471 is in contact with the gas box 50 only through the thermal isolator 475. The thermal isolator 475, therefore, works to minimize heat transfer from the gas distribution plate 471 to the gas box 50.

Other means for minimizing heat transfer from the gas distribution plate to the gas box 50 are also contemplated by the invention. For instance, the o-rings 46 between the gas distribution plate and the gas box 50 may be positioned closer toward the periphery of the gas distribution plate and the gas box 50 so as to increase the space between the two components.

Figure 5A:
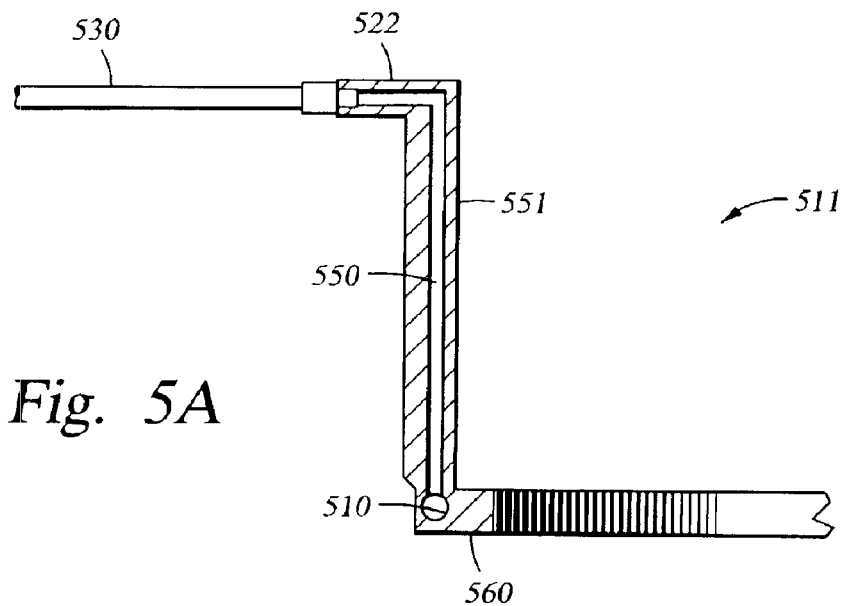
FIG. 5A illustrates a partial schematic cross-sectional view of a gas distribution plate in accordance with an embodiment of the invention.
Figure 5B:
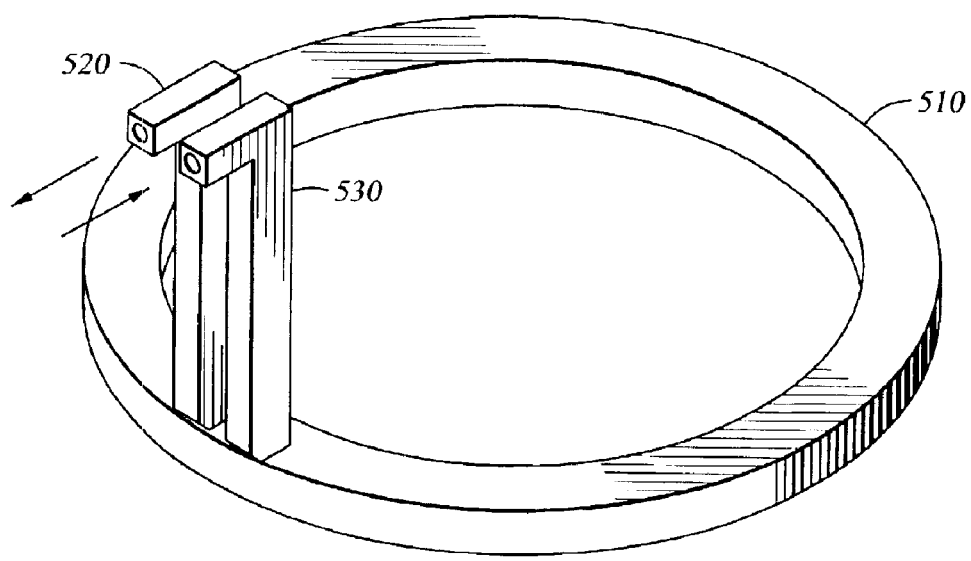
FIG. 5B illustrates a schematic perspective view of a high temperature heat exchanger fluid channel in accordance with an embodiment of the invention.

FIG. 5A illustrates a partial schematic cross-sectional view of a gas distribution plate 511 in accordance with an embodiment of the invention. The gas distribution plate includes a flange portion 522, a side wall 551 and a bottom plate 560. The gas distribution plate 511 further includes a channel 510 disposed inside the bottom plate 560 for containing fluid, such as, a high temperature heat exchanger fluid 550. Other types of fluid that may heat the gas distribution plate 511 are also contemplated by the invention. The channel 510 may be disposed circumferentially around the perimeter of the bottom plate 560. In one embodiment, the channel 510 is disposed on the same level as the plurality of holes (not shown) disposed through the bottom plate 560. In this manner, the high temperature heat exchanger fluid 550 is configured to provide heating throughout the gas distribution plate 511. The heat exchanger fluid 550 may be provided by a heat exchanger system (not shown) at high temperatures sufficient to heat the gas distribution plate 511 to approximately between 200 to 300 degrees Celsius. The channel 510 may also include an inlet 520 and an outlet 530 for the fluid, which are disposed inside the flange portion 522 and the side wall 551 on one side of the gas distribution plate 511, as shown in FIG. 5B. The inlet 520 and the outlet 530 may be made from a polyamide composition material, such as Vespel® by Dupont of Newark, Del. In this manner, the inlet 520 and the outlet 530 may serve as RF insulators, insulating the high temperature heat exchanger fluid 550 from the outside environment.

Figure 6A:
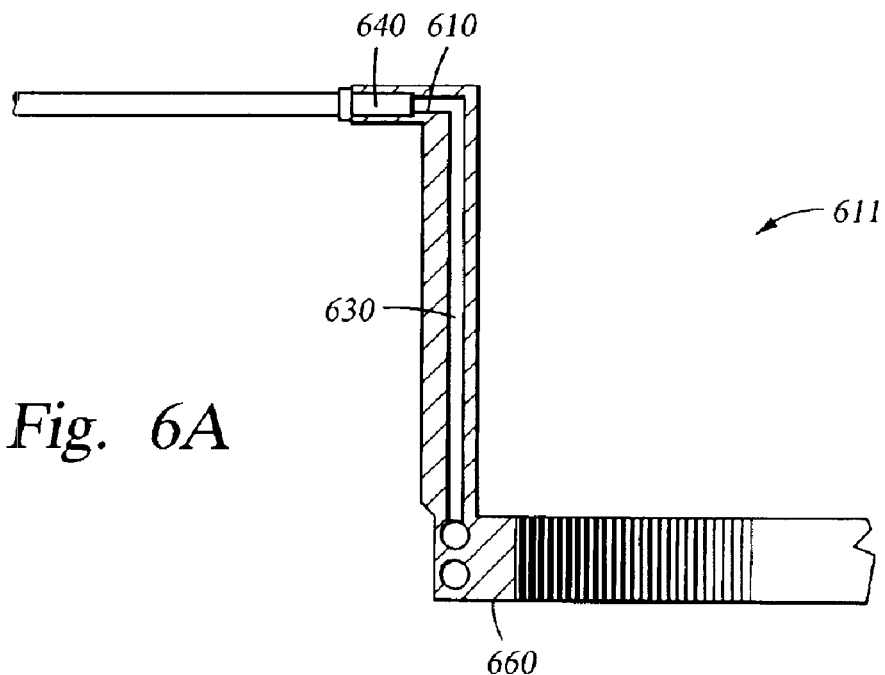
FIG. 6A illustrates a partial schematic cross-sectional view of a gas distribution plate in accordance with an embodiment of the invention.
Figure 6B:
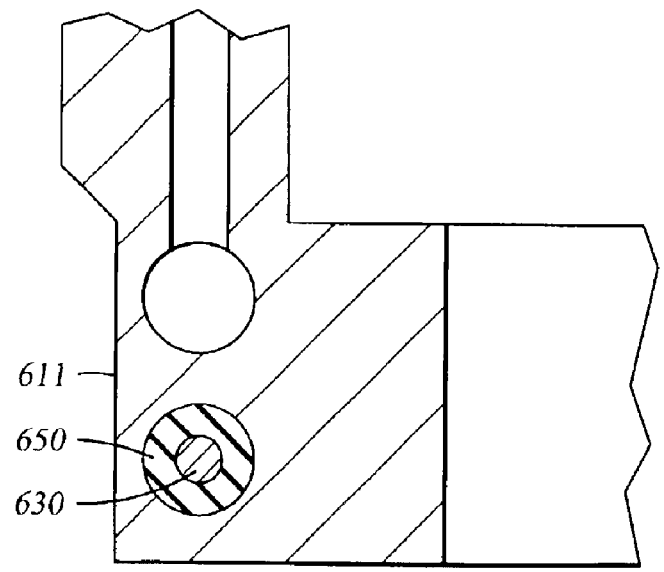
FIG. 6B illustrates a cross-sectional view of a heating element in accordance with an embodiment of the invention.

Another embodiment in which the gas distribution plate may be heated is illustrated in FIG. 6A. In this embodiment, the gas distribution plate 611 includes a channel 610 disposed inside a bottom plate 660 for containing a heating element 630. In another embodiment, the heating element 630 may be cast in place in a molded or otherwise fabricated gas distribution plate 611. The heating element 630 may be disposed circumferentially around the perimeter of the bottom plate 660. The heating element 630 may be disposed on the same level as the plurality of holes (not shown) disposed through the bottom plate 660. In this manner, the heating element 630 is configured to electrically provide heating around the gas distribution plate 611. In one example, the heating element 630 is configured to heat the gas distribution plate 611 to a temperature of approximately between 200 and 300 degrees Celsius. FIG. 6B illustrates that the heating element 630 may be insulated with RF insulating material 650, such as, magnesium oxide, fiber glass or NYLON, which may be available from Watlow Electric Manufacturing Company of St. Louis, Mo. An adapter 640 may be connected to the heating element 630 to reduce the potential danger from the RF hot material extruding out of the gas distribution plate 611. The adapter 640 may also protect the o-ring (not shown) disposed between the gas distribution plate 611 and the gas box (not shown) since the temperature of the adapter 640 is significantly lower than the temperature of the heating element 630.

While the foregoing is directed to embodiments of the present invention, other and further embodiments of the invention may be devised without departing from the basic scope thereof, and the scope thereof is determined by the claims that follow.

Another embodiment in which the gas distribution plate may be heated is illustrated in FIG. 6A. In this embodiment, the gas distribution plate 611 includes a channel 610 disposed inside a bottom plate 660 for containing a heating element 630. In another embodiment, the heating element 630 may be cast in place in a molded or otherwise fabricated gas distribution plate 611. The heating element 630 may be disposed circumferentially around the perimeter of the bottom plate 660. The heating element 630 may be disposed on the same level as the plurality of holes (not shown) disposed through the bottom plate 660. In this manner, the heating element 630 is configured to electrically provide heating around the gas distribution plate 611. In one example, the heating element 630 is configured to heat the gas distribution plate 611 to a temperature of approximately between 200 and 300 degrees Celsius. FIG. 6B illustrates that the heating element 630 may be insulated with RE insulating material 650, such as, magnesium oxide, fiber glass or NYLON, which may be available from Watlow Electric Manufacturing Company of St. Louis, Mo. An adapter 640 may be connected to the heating element 630 to reduce the potential danger from the RF hot material extruding out of the gas distribution plate 611. The adapter 640 may also protect the o-ring (not shown) disposed between the gas distribution plate 611 and the gas box (not shown) since the temperature of the adapter 640 is significantly lower than the temperature of the heating element 630.

What is claimed:

1. An apparatus for distributing gas in a processing system, comprising:
a gas distribution assembly having:
a gas distribution plate comprising a flange portion disposed around the gas distribution plate and a bottom plate defining a plurality of holes through which gases are transmitted;
a gas box coupled to the gas distribution plate, the gas box being configured to supply the gases into the plurality of holes; and
an electrical heating element disposed inside the bottom plate for heating the bottom plate.

2. The apparatus claim 1, further comprising a radio frequency (RF) gasket disposed between the gas distribution plate and the gas box configured for providing a spacing between the flange portion of the gas distribution plate and the gas box.

3. The apparatus of claim 1, further comprising one or more recesses between the flange portion of the gas distribution plate and the gas box.

4. The apparatus of claim 1, further comprising a thermal isolator disposed between the gas box and the gas distribution plate, the isolator being configured to eliminate contact between the gas box and the flange portion of the gas distribution plate.

5. The apparatus of claim 1, wherein the electrical heating element is configured to heat the gas distribution plate to a temperature of approximately between 200° and 300° Celsius.

6. The apparatus of claim 1, wherein the heating element is disposed around the plurality of holes.

7. The apparatus of claim 1, wherein the heating element is insulated with radio frequency (RF) insulating material.

8. A gas distribution assembly for a processing system, comprising:
a gas distribution plate comprising a flange portion and a bottom plate defining a plurality of holes through which gases are transmitted;
a gas box coupled to the gas distribution plate through the flange portion, the gas box being configured to supply the gases into the plurality of holes;
an electrical heating element disposed inside the bottom plate for heating the bottom plate; and
a radio frequency (RF) gasket disposed between the flange portion of the gas distribution plate and the gas box forming a spacing therein to reduce the contact area between the gas distribution plate and the gas box, and thereby reducing heat transfer from the gas distribution plate to the gas box.

9. The gas distribution assembly of claim 8, wherein the heating element is disposed within a channel around the plurality of holes.

10. The gas distribution assembly of claim 8, wherein the heating element is disposed around the plurality of holes.

11. The gas distribution assembly of claim 8, wherein the heating element is insulated with a radio frequency (RF) insulating material selected from the group consisting of magnesium oxide, fiber glass and NYLON.

12. The apparatus of claim wherein 3, the recesses provide a distance between the gas distribution plate and the gas box for complete separation, thereby reducing heat transfer from the gas distribution plate to the gas box.

13. The apparatus of claim 4, wherein the isolator is made from a ceramic material.

14. The apparatus at claim 1, wherein the electrical heating element is circumferentially disposed around a perimeter of the bottom plate.

15. The apparatus of claim 6, wherein the electrical heating element is circumferentially disposed around a perimeter of the bottom plate.

16. The gas distribution assembly of claim 8, further comprising
a thermal isolator disposed between the gas box and the flange portion of the gas distribution plate, wherein the thermal isolator is configured to eliminate contact between the gas box and the flange portion of the gas distribution plate.

17. The gas distribution assembly of claim 16, wherein the thermal isolator is made from a ceramic material.

* * * * *

UNITED STATES PATENT AND TRADEMARK OFFICE
CERTIFICATE OF CORRECTION

PATENT NO. : 6,946,033 B2
DATED : September 20, 2005
INVENTOR(S) : Lun Tsuei et al.

It is certified that error appears in the above-identified patent and that said Letters Patent is hereby corrected as shown below:

Column 6,
Remove paragraph which begins at line 37 and ends at line 63.

Signed and Sealed this

Eleventh Day of April, 2006

JON W. DUDAS
*Director of the United States Patent and Trademark Office*